United States Patent [19]
Langley

[11] Patent Number: 5,094,900
[45] Date of Patent: Mar. 10, 1992

[54] SELF-ALIGNED SLOPED CONTACT

[75] Inventor: Rod C. Langley, Boise, Id.

[73] Assignee: Micron Technology, Inc., Boise, Id.

[21] Appl. No.: 508,439

[22] Filed: Apr. 13, 1990

[51] Int. Cl.$^5$ .............................................. B32B 3/00
[52] U.S. Cl. .................................. 428/131; 428/209; 428/446; 428/901
[58] Field of Search ................ 428/209, 446, 901, 131

[56] References Cited

U.S. PATENT DOCUMENTS 4,732,801  3/1988  Joshi ..................................... 428/446
4,875,971  10/1989  Orbach et al. ........................ 428/446

Primary Examiner—Patrick J. Ryan
Assistant Examiner—Elizabeth Evans
Attorney, Agent, or Firm—Albert M. Crowder, Jr.

[57] ABSTRACT

A self-aligned, sloped contact, through BPSG and thick TEOS (at least 200 nm but preferably 300-500 nm or more). Sloping is achieved through exploitation of BPSG and TEOS etch characteristics, to independently form concave and convex sidewalls, respectively. Self-alignment is obtained through thick conformal TEOS, along a sidewall of an underlying structure such as a transistor gate, directing contact formation away from the structure. TEOS etch is timed, allowing simultaneous formation of contacts to substrate and gates without overetching gates.

19 Claims, 7 Drawing Sheets

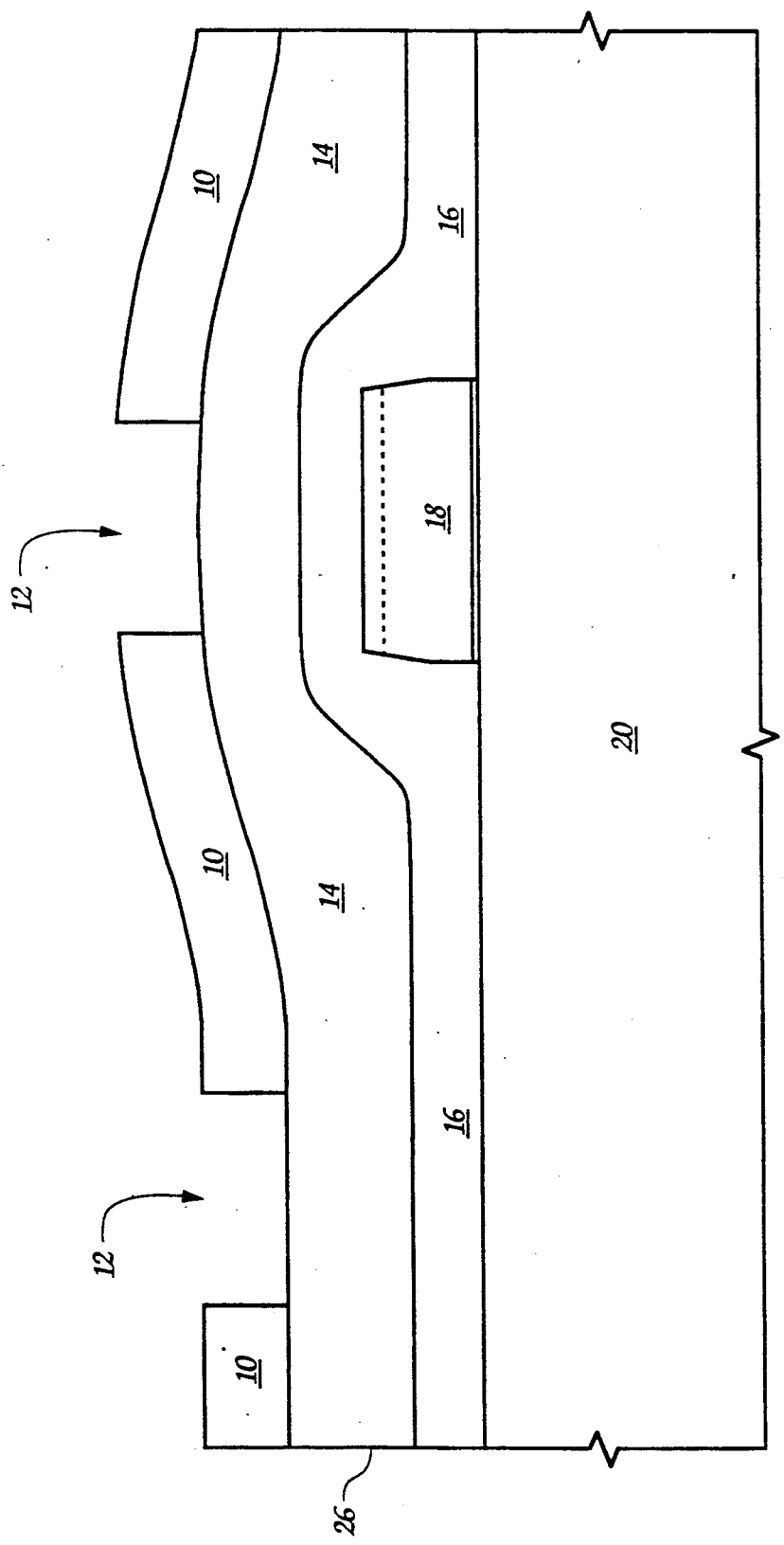

SELF-ALIGNED SLOPED CONTACT

BACKGROUND OF THE INVENTION

The present invention relates to contact structures in integrated circuits.

An electronic circuit is chemically and physically integrated into a substrate such as a silicon wafer by patterning regions in the substrate, and by patterning layers on the substrate. Patterning is generally done using well known photolithographic methods. These regions and layers can be conductive, for conductor and resistor fabrication, or insulative, for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible.

Conductive layers (of metal such as aluminum, or of doped polycrystalline silicon, for example) are typically isolated from one another by a dielectric layer such as an oxide or nitride of silicon. It is often desirable to contact overlying metal to underlying polycrystalline silicon ("poly") or underlying substrate by etching a contact hole in the intervening dielectric and allowing the metal to flow into the hole during metal deposition. A contact to poly is called a "poly contact", and a contact to substrate is called a "substrate contact".

BRIEF DESCRIPTION OF THE DRAWINGS

The invention will be better understood with reference to these drawings:

FIGS. 4A-4C illustrate how, for an embodiment of the invention, poly and substrate contacts my be simultaneously formed, without the overetch problem shown in FIG. 3.

DISCUSSION OF RELATED ART

Figure 1C:
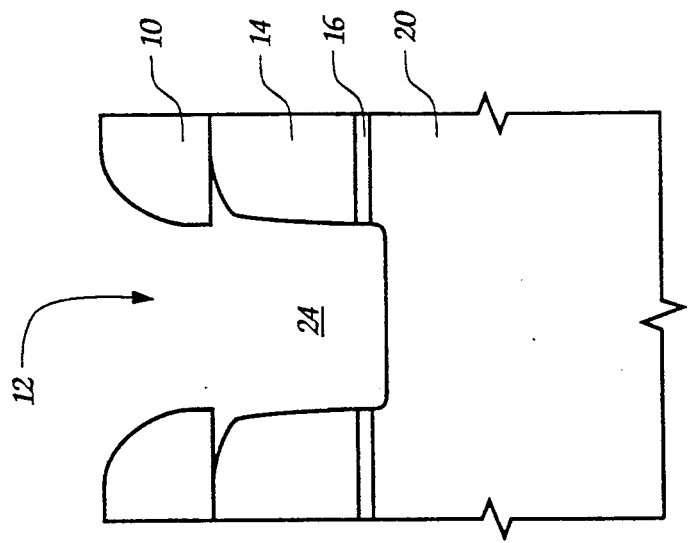
FIGS. 1A-1C illustrate a representative prior art method to etch a substrate contact.
Figure 1B:
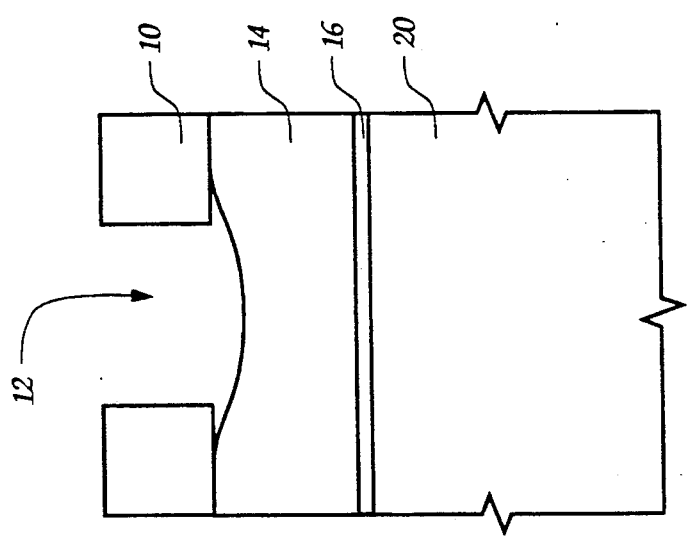
Figure 1A:
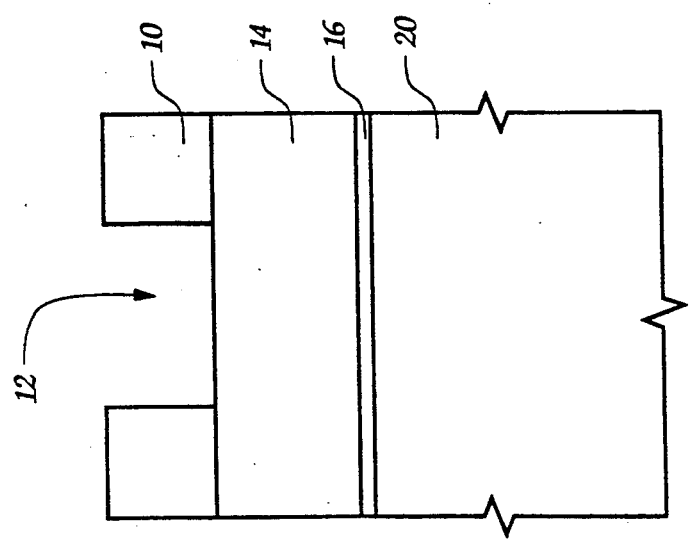

A representative contact and etch process, illustrated in FIGS. 1A-C and 2, is now described.

A typical layered structure is provided which includes approximately 1000 nm photoresist 10 ("resist") with a 1.2 μm mask opening 12, for example, over 1400-1500 nm reflowed BPSG 14, over 150 nm TEOS 16, over 500 nm poly structures 18 such as runners or transistor gates, over a silicon substrate 20. "TEOS" signifies tetraethylorthosilicate. "Reflowed BPSG" is borophosphosilicate glass which has been heated enough to flow in order to attain a relatively smooth upper surface. A smooth BPSG surface is desirable for better fabrication of subsequent layers such as metal 22. TEOS and BPSG are both oxides of silicon.

BPSG reflow characteristics are adjusted by varying its boron and/or phosphorus dopant levels. A thin (150±10 nm), conformal layer of TEOS 16 is generally provided as a barrier between BPSG 14 and poly structures 18 or substrate 20, to prevent dopants in the BPSG 14 from diffusing into poly 18 or substrate 20, altering their conductivities.

An isotropic etch is effected into BPSG 14 approximately 300-500 nm. The etch undercuts resist 10 approximately 1-1.5 μm on each side of mask opening 12 to form a slope. Typically, this is a chemical, or "wet", etch.

The structure is then submitted to an etch process which anisotropically etches the rest of the way down through BPSG 14 and TEOS 16 to substrate 20. This may be a wet etch, or a plasma ("dry") etch.

Under this process, the finished contact hole 24 has a top opening of approximately 3 μm, and a bottom opening of approximately 1.5 μm.

Care must be taken during contact etch. If the contact sidewalls are too steep or its corners too sharp, step coverage by a metal layer over and in the contact hole is impaired, making the finished contact weakly connected or simply open. In a contact etch process, then, it is desirable to be able to control the slope of the contact sidewalls. In the example, this control is provided by two etch steps—one to slope the contact top, and one to open the contact to the underlying layer.

Figure 2:
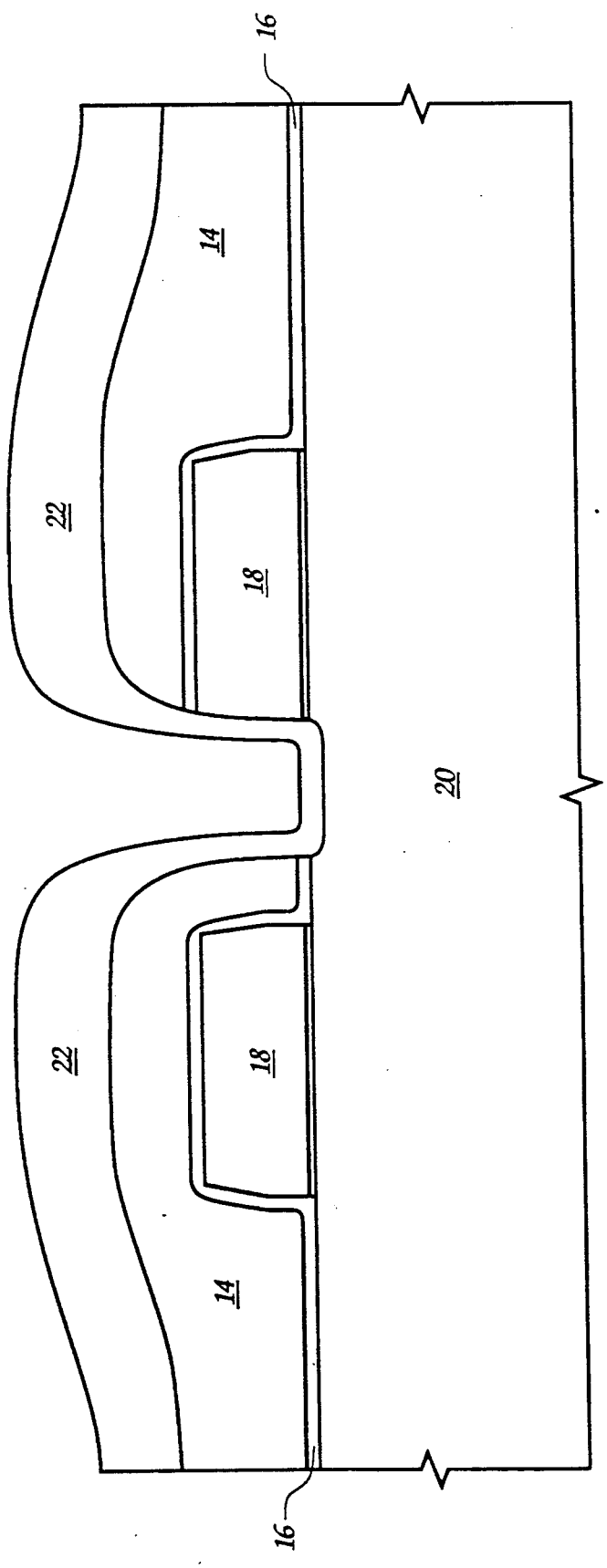
FIG. 2 shows how the prior art method is not self-aligning. A misaligned contact mask causes poly and substrate to be exposed in a single contact. Metal filling the contact undesirably shorts poly to substrate. Also notice in this drawing how thin the metal is in the contact.

Herein lie some disadvantages:

1) The contact is not self-aligning. That is, if mask opening 12 is misaligned, the contact hole when filled with metal may short poly to substrate, as shown in FIG. 2.

Figure 3:
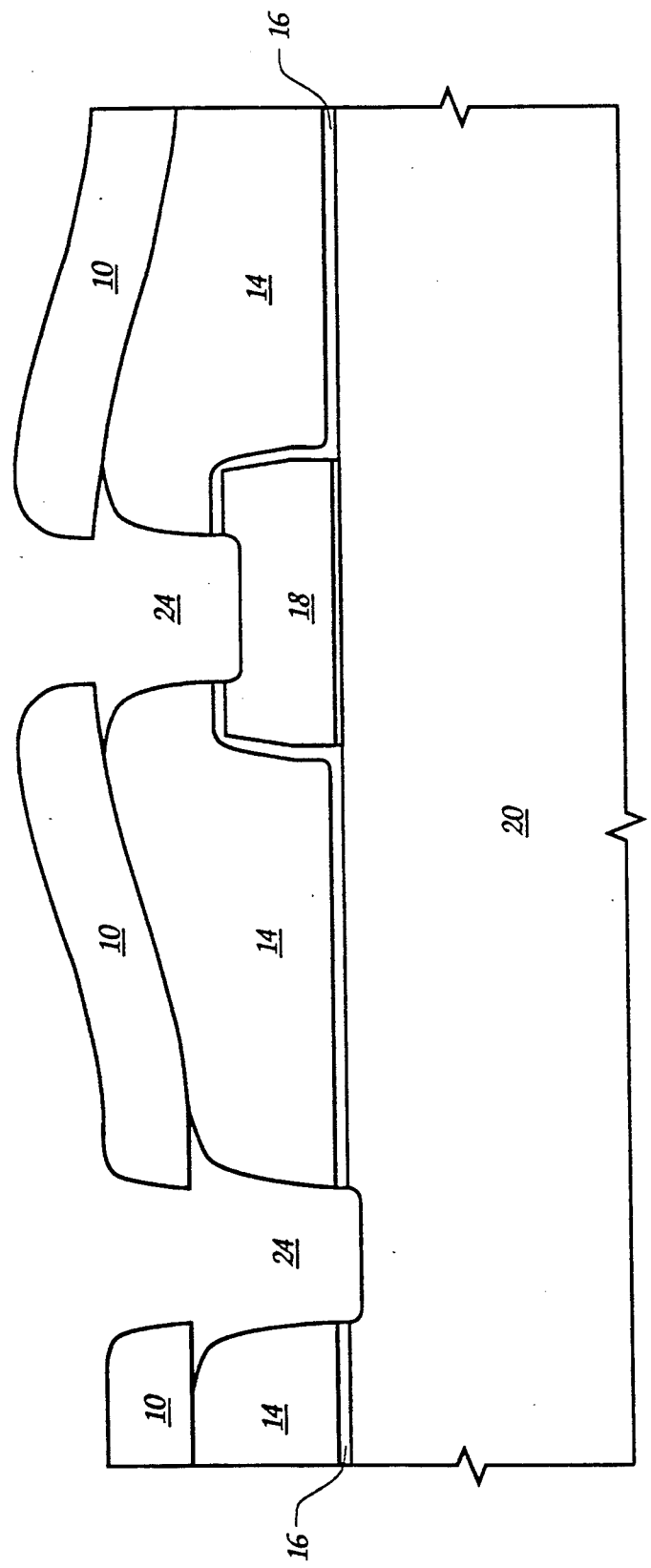
FIG. 3 illustrates the difficulties of simultaneously etching poly contacts and substrate contacts using the representative prior art method. For a sufficiently opened substrate contact, poly is overetched in the poly contact.

2) It is difficult to simultaneously etch poly contacts and substrate contacts uniformly, as shown in FIG. 3. Although TEOS has excellent conformality over varying topographies, reflowed BPSG over an elevated region such as poly structure 18 will be thinner than BPSG over substrate. When the substrate contact is sufficiently formed, the poly contact is overetched (this is the situation shown in FIG. 3).

3) The contact profile could stand some improvement, specifically a smoother or nonexistent "knee" and a gentler slope. This contact thins metal in the contact to about 12-15% of its normal thickness outside of the contact. Greater metal thickness in the contact is desired.

4) Although this representative contact etch provides some degree of opening and slope controllability, the mask opening tends to widen during the second step, making the resulting bottom opening wider than the original mask opening.

SUMMARY OF THE INVENTION

The invention is directed toward a contact that overcomes the above disadvantages.

Figure 5:
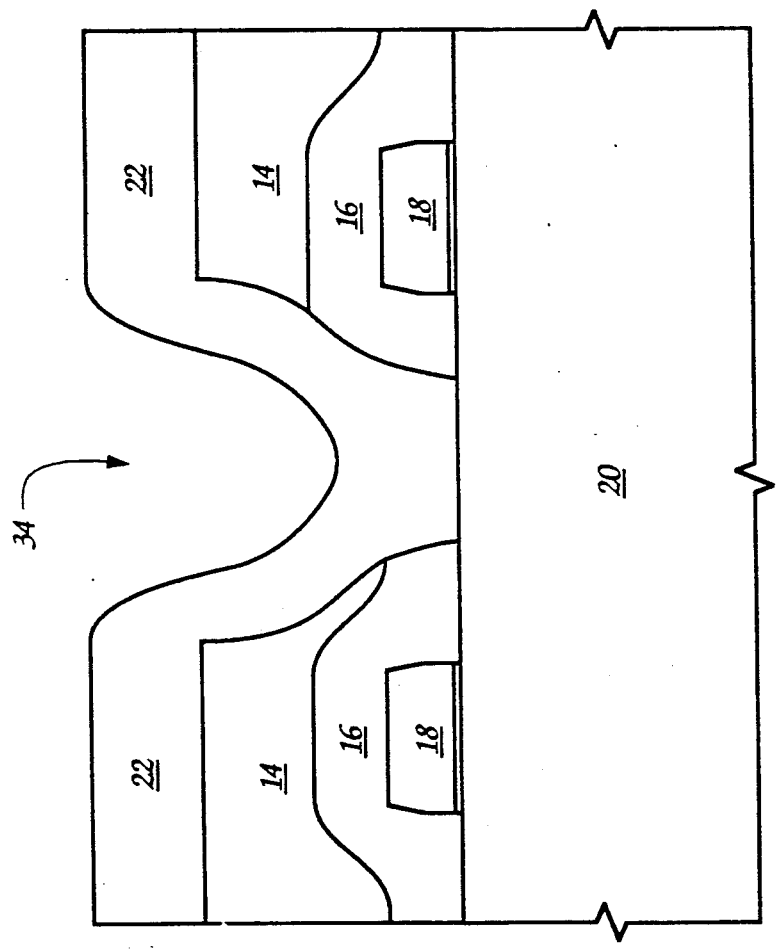
FIG. 5 shows how the inventive contact is self-aligning. Also notice the improved metal thickness in the contact.

Self-alignment is provided by thick conformal TEOS on poly sidewalls, which directs a misaligned substrate contact etch away from the poly structure, as illustrated in FIG. 5. Usually TEOS under BPSG is quite thin, only thick enough to provide a diffusion barrier, as already noted. However, in the inventive structure and method, TEOS is made thick. Naturally, it still acts as a diffusion barrier as well.

Because TEOS has excellent conformality characteristics, TEOS thickness over high topographies is about the same as TEOS thickness over low topographies. A TEOS selective BPSG etch is used to expose TEOS. A timed etch through TEOS is then used, which opens substrate contacts and poly contacts at about the same time, thus allowing simultaneous etch of substrate and poly contacts.

The profile is obtained by exploiting the etch characteristics of BPSG and TEOS. BPSG is isotropically etched to form a concave sidewall in the contact top opening, and TEOS is nearly anisotropically etched to form a convex sidewall in the contact bottom opening. This profile offers improved metal thickness in the contact, about 30% of the metal thickness outside of the contact.

Because contact top and bottom openings are controlled by separate etches into separate layers of adjustable thickness, excellent controllability is provided.

The inventive contact can be formed between two conductive layers of any type, such as metal-to-metal and poly-to-poly, as well as metal-to-poly.

DETAILED DESCRIPTION OF THE PREFERRED EMBODIMENTS

As shown in FIG. 4A, in a semiconductor device, a dielectric layer 26 is provided to isolate metal from substrate 20 or a structure such as poly gate 18, and is composed of a layer of BPSG 14 over a layer of TEOS 16.

For example, for BPSG 14 nominally 800-1000 nm thick for sufficient smoothness over 500 nm thick poly structures 18, TEOS 16 is nominally 500 nm thick but could range within 300-700 nm.

Resist mask 10 is provided over BPSG 14, using well known methods. For example, resist 10 was 1050±10 nm thick, with a mask opening 12 of 0.9-1.0 μm.

Figure 4B:
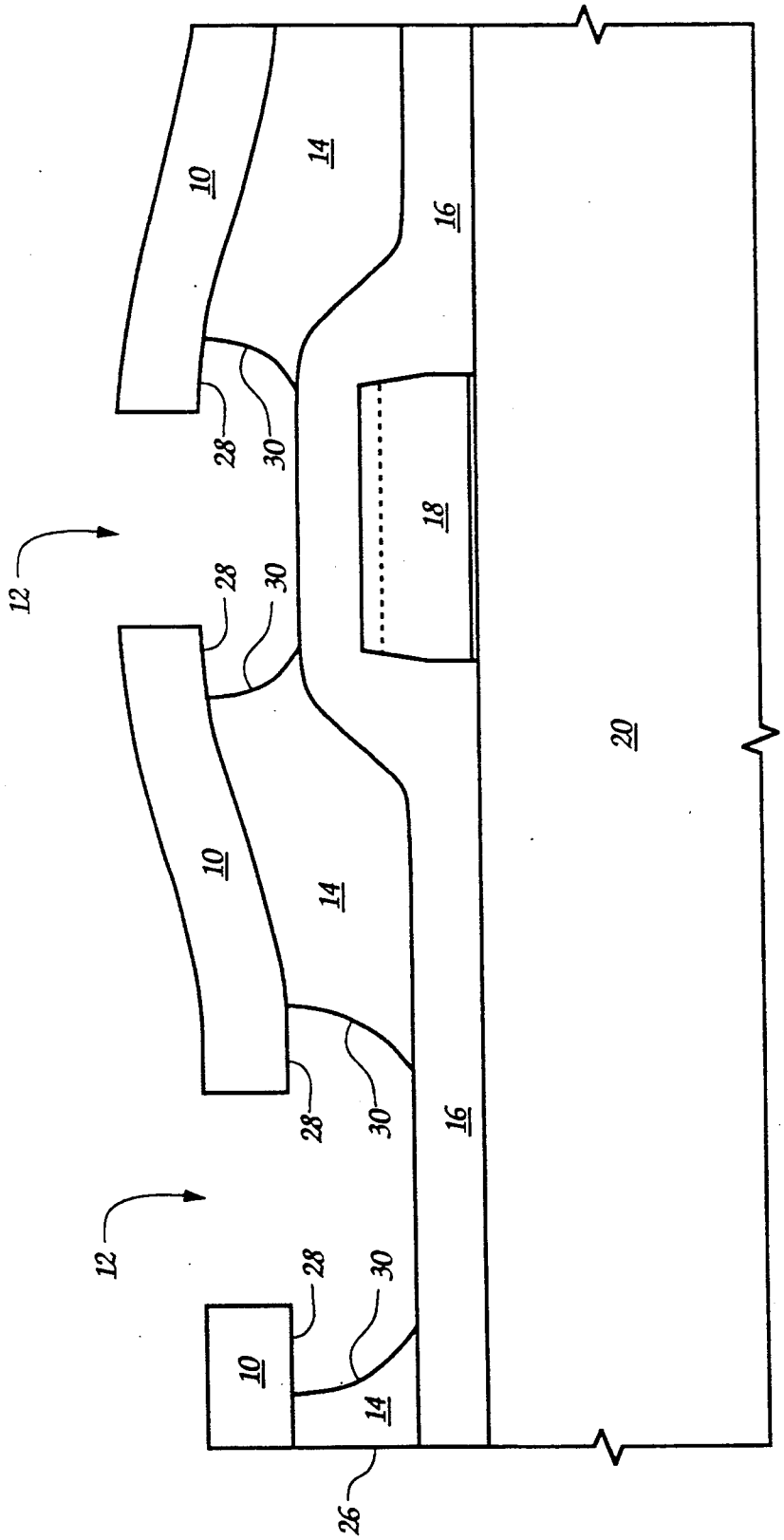

As shown in FIG. 4B, a first etch step is done, using:
1.5±0.1 Torr,
600±50 W,
70±20% flow $NF_3$, and
30±10% flow He, at
65±20° C.

This is preferably done in a downstream plasma etcher such as sold by Matrix Integrated Systems, of Richmond, Calif., chosen for its excellent isotropic etch tendencies.

It may appear that at upper flow limits of 90% $NF_3$ and 40% He, that 130% gas flow is achieved. "% flow" is not to be interpreted as percent of total flow. Each gas flows through its own mass flow controller (MFC) at a certain capacity of the MFC. "70% flow $NF_3$" means the $NF_3$ MFC is opened to 70% of its maximum capacity.

Although a preferred temperature is shown, a wide range can be used. Higher temperature in this case increases lateral etch.

This etch endpoints on TEOS (4:1 BPSG:TEOS selectivity), and consumes approximately 500 nm BPSG per minute. An undercut 28 is formed. Concave BPSG sidewalls 30 are formed.

Figure 4C:
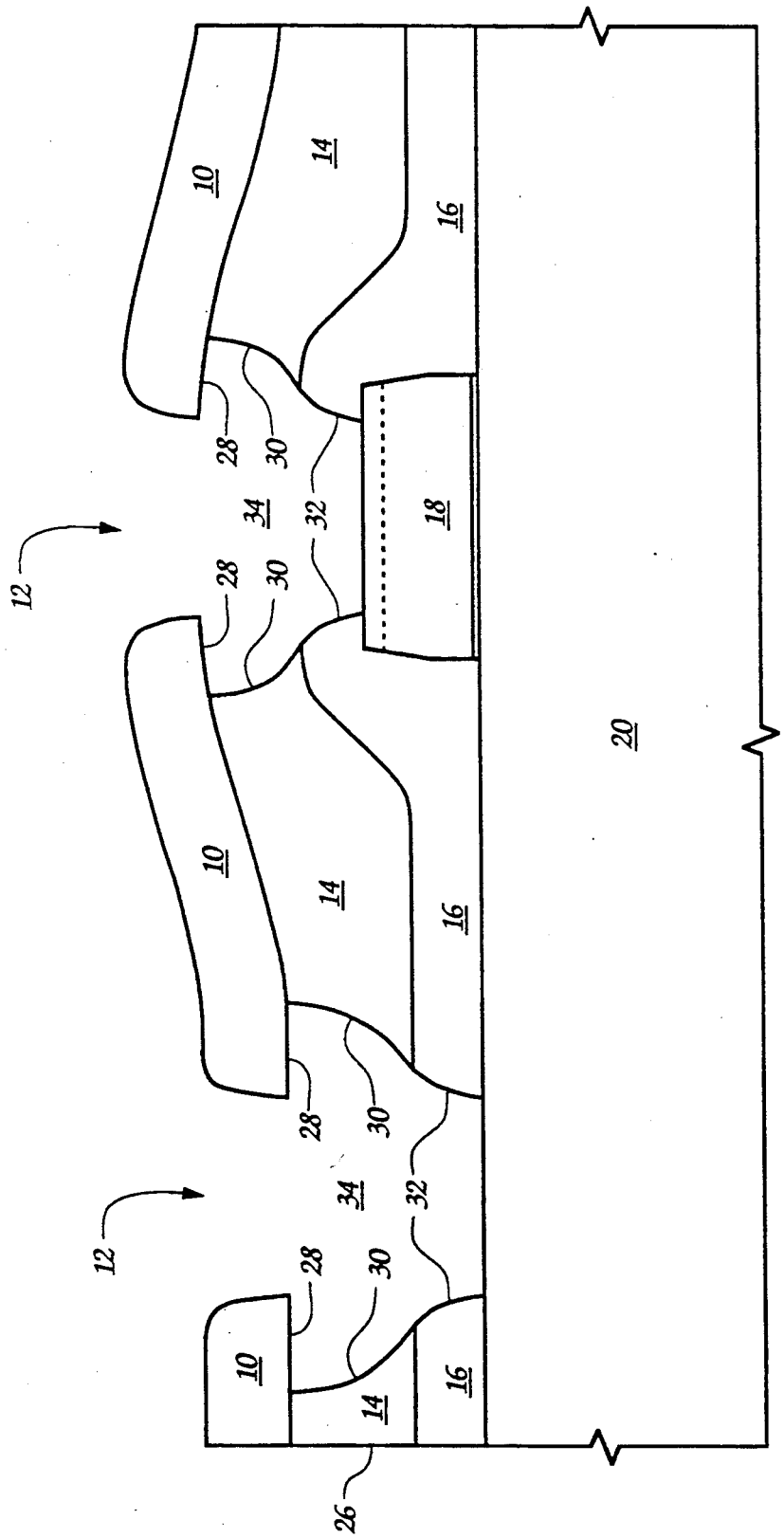

As shown in FIG. 4C, a second etch step is done, using:
2.4±0.2 Torr,
900±200 W (3.2±0.7 W/cm²),
0.40±0.06 cm gap,
120±40 sccm He,
45±10 sccm $CHF_3$,
50±20 sccm $CF_4$, and
a consumable cathode.

This is preferably done in a diode plasma etcher such as a Lam 590, sold by Lam Research Corporation of Fremont, Calif., chosen for its unique ability to nearly, but not completely, anisotropically etch, making a near vertical sidewall 32 with a gentle convexity. It is believed that this sidewall formation is somehow improved by turbulence effects due to undercut 28.

Helium provides etch uniformity. $CF_4$ etches silicon. $CHF_3$ acts to inhibit the action of $CF_4$, improving selectivity to silicon, and reducing resist erosion.

The consumable cathode is preferably graphite or silicon, and improves etch selectivity to silicon. This is useful for TEOS etch overlying silicon, such as in substrate and poly contacts. For TEOS overlying metal, such as in a metal-to-metal contact, a non-consumable cathode such as anodized aluminum is acceptable.

For etches stopping on silicon, such as in substrate and poly contacts, approximately 1:1 $CHF_3:CF_4$ is desirable. For etches stopping on metal, such as in a metal-to-metal contact, approximately 1:2 $CHF_3:CF_4$ works fine (enough $CHF_3$ to prevent excessive resist erosion).

This etch can be performed with $CHF_3$ only, but prohibitive amounts of polymer are formed within the etch chamber.

This is a timed etch, normally consuming about 600 nm TEOS per minute, but possibly consuming as low as 400 nm per minute in a TEOS depression such as exists between two closely spaced poly structures 18, such as illustrated in FIG. 5. Selectivity to silicon is approximately 7:1. No overetch is required. For the given TEOS and BPSG thicknesses, for example, 270±30 seconds work well for the self-aligning contact 34 of FIG. 5.

Note that because the TEOS etch step is timed, a contact 34 can be formed to an underlying layer of any composition, not just poly 18 or substrate silicon 20. For example, in the preferred embodiment, poly structure 18 actually included a tungsten silicide layer at its top. Further, contact hole 34 formation is independent of material that actually later fills the contact hole. Therefore the inventive structure and method apply to contacting two layers of any composition. Presumably, but not necessarily, both layers will be conductive. Conductive compositions include metal, poly (any degree of doping), and metal silicides, among others.

Although preferred wattages are specified, these etches can be performed at much lower powers, such as 100 W, but etch speed is lost.

Self-alignment is illustrated in FIG. 5. It is seen that thick TEOS 16 directs TEOS etch away from higher topographies such as poly gate 18.

To finish the contact, mask layer 10 is removed, and a conductive layer 22 such as metal is deposited over and in contact 34.

BPSG 14 thickness is dependent on flatness or smoothness required for overlying layers in the integrated circuit. TEOS 16 thickness is dependent on amount of isotropy desired at midpoint of contact, and the distance between poly gates 18, illustrated in FIG. 5, and on the amount of misalignment anticipated.

For example, for a self-aligning contact between gates about 2 μm apart and 1 μm wide, a desirable TEOS thickness was 500 nm, giving a contact bottom opening about 1-1.2 μm wide. BPSG in this case was preferably 800-1000 nm thick. I wish it to be understood that TEOS must be at least 200 nm thick, but preferably 300-500 nm or more. In this example, for this thickness of BPSG, 700 nm TEOS was about the thickest desirable.

In another example, for a self-aligning contact between gates about 1 μm apart and 1 μm wide, a desirable TEOS thickness is 200 nm, giving a contact bottom opening about 0.6 μm wide. BPSG thickness is about the same as before.

Equivalent etches might routinely be found that will give same or similar profiles for the given BPSG:TEOS structure. Other etchers might be used.

BPSG, TEOS, resist, poly, and substrate, disclosed above, are all fabricated using well-known methods, and hence are not further disclosed. Although the BPSG is boron rich for reflow purposes, BPSG doping is not considered critical to the invention.

Further, the inventive concept is useful not only in contact formation, but in TEOS and/or BPSG sidewall formation in general.

TEOS was selected because it is an effective boron diffusion barrier and has excellent conformity. Other layers are contemplated as usable, but not as effectively, such as PSG (phosphosilicate glass), or undoped oxide formed by atmospheric chemical vapor deposition (ACVD) or by plasma enhanced chemical vapor deposition (PECVD). Nitride might also be used. If an underlying layer or structure such as metal is not sensitive to boron diffusion, the diffusion barrier requirement may be overlooked.

I wish it to be understood that the use of the word "substrate" in the claims below is intended to also be applicable to a layer or structure which acts as a substrate to the structure presented.

I claim:

1. A contact, comprising:
   a BPSG layer;
   a TEOS layer, underlying said BPSG layer, at least 300 nm thick;
   a concavely sidewalled contact top opening in said BPSG layer, formed by isotropic etch;
   a convexly sidewalled contact bottom opening in said TEOS layer, formed by anisotropic etch;
   said contact top and bottom openings being contiguous, so forming a contact hole through said BPSG and TEOS layers;
   a layer overlying said BPSG layer, selected from the electrically conductive group of metal, silicon, and metal silicides; and
   a layer underlying said TEOS layer, selected from the group of metal, silicon, and metal silicides;
   said overlying layer contacting said underlying layer through said contact hole.

2. A contact, comprising:
   a BPSG layer;
   a TEOS layer, having a minimum thickness of 200 nm, underlying said BPSG layer;
   a concavely sidewalled contact top opening in said BPSG layer;
   a convexly sidewalled contact bottom opening in said TEOS layer;
   said contact top and bottom openings being contiguous, so forming a contact hole through said BPSG and TEOS layers;
   a layer overlying said BPSG layer; and
   a layer underlying said TEOS layer;
   said overlying layer contacting said underlying layer through said contact hole.

3. The contact of claim 2, wherein said overlying and underlying layers are electrically conductive.

4. The contact of claim 3, wherein said overlying and underlying layers have compositions selected from the group of metal, silicon, and metal silicides.

5. The contact of claim 2, wherein said concavely sidewalled contact top opening is formed by isotropic etch.

6. The contact of claim 2, wherein said convexly sidewalled contact bottom opening is formed by anisotropic etch.

7. The contact of claim 2, wherein said TEOS layer is at least 300 nm thick.

8. The contact of claim 2, wherein said TEOS layer is at least 500 nm thick.

9. A self-aligned contact, comprising:
   a substrate;
   a structure on said substrate;
   a TEOS layer, having a minimum thickness of 200 nm, overlying said substrate and said structure, conformal to a profile defined by said substrate and said structure;
   a BPSG layer, overlying said TEOS layer;
   a concavely sidewalled contact top opening in said BPSG layer;
   a convexly sidewalled contact bottom opening in said TEOS layer;
   said contact top and bottom openings being contiguous, so forming a contact hole through said BPSG and TEOS layers; and,
   a layer overlying said BPSG layer
   and contacting said substrate through said contact hole.

10. The self-aligned contact of claim 9, wherein said TEOS layer is at least 300 nm thick.

11. The self-aligned contact of claim 9, wherein said TEOS layer is at least 500 nm thick.

12. The self-aligned contact of claim 9, wherein said substrate and said overlying layer are electrically conductive.

13. The self-aligned contact of claim 9, wherein said substrate is selected from the group of metal, silicon, and metal silicides.

14. The self-aligned contact of claim 9, wherein said overlying layer is selected from the group of metal, silicon, and metal silicides.

15. The self-aligned contact of claim 9, wherein said structure is selected from the group of metal, silicon, and metal silicides.

16. A method to form a contact, comprising the steps of:
   providing a substrate;
   providing a TEOS layer at least 200 nm thick and a BPSG layer over said substrate, such that said BPSG layer overlies said TEOS layer;
   masking said BPSG layer, leaving an exposed region of said BPSG layer where the contact is desired;
   isotropically etching said exposed BPSG region, until a portion of said TEOS layer is exposed and said BPSG layer is undercut, to provide a concavely sidewalled contact top opening in said BPSG layer;
   anisotropically etching said exposed TEOS portion, until a portion of said substrate is exposed, to provide a convexly sidewalled contact bottom opening in said TEOS layer, contiguous with said contact top opening, said top opening and said bottom opening together forming a contact hole through said BPSG and TEOS layers;
   demasking said BPSG layer; and providing a top layer over and in said contact hole, thus forming a contact from said top layer to said substrate.

17. A contact, formed by:
providing a substrate;
providing a TEOS layer at least 200 nm thick and a BPSG layer over said substrate, such that said BPSG layer overlies said TEOS layer;
masking said BPSG layer, leaving an exposed region of said BPSG layer where the contact is desired;
isotropically etching said exposed BPSG region, until a portion of said TEOS layer is exposed and said BPSG layer is undercut, to provide a concavely sidewalled contact top opening in said BPSG layer;
anisotropically etching said exposed TEOS portion, until a portion of said substrate is exposed, to provide a convexly sidewalled contact bottom opening in said TEOS layer, contiguous with said contact top opening, said top opening and said bottom opening together forming a contact hole through said BPSG and TEOS layers;
demasking said BPSG layer; and providing a top layer over and in said contact hole, thus forming a contact from said top layer to said substrate.

18. A self-aligned contact, formed by:
providing a substrate;
providing a structure on said substrate;
providing a TEOS layer at least 200 nm thick, overlying said substrate and said structure, conformal to a profile defined by said substrate and said structure;
providing a BPSG layer, overlying and conformal to said TEOS layer;
masking said BPSG layer, leaving an exposed region of said BPSG layer where the contact is desired, next to said structure;
isotropically etching said exposed BPSG region until a portion of said TEOS layer is exposed and said BPSG layer is undercut, to provide a concavely sidewalled contact top opening in said BPSG layer;
anisotropically etching said exposed TEOS portion until a portion of said substrate is exposed, to provide a convexly sidewalled contact bottom opening in said TEOS layer, contiguous with said contact top opening, said top opening and said bottom opening together forming a contact hole through said BPSG and TEOS layers;
said contact bottom opening being directed away from said structure during said anistropic etch by said TEOS layer;
demasking said BPSG layer; and
providing a conductive top layer over and in said contact hole, thus forming a contact from said top layer to said substrate.

19. An integrated circuit, having a contact, comprising:
a BPSG layer;
a TEOS layer, underlying said BPSG layer, at least 300 nm thick;
a concavely sidewalled contact top opening in said BPSG layer, formed by isotropic etch;
a convexly sidewalled contact bottom opening in said TEOS layer, formed by anisotropic etch;
said contact top and bottom openings being contiguous, so forming a contact hole through said BPSG and TEOS layers;
a layer overlying said BPSG layer, selected from the electrically conductive group of metal, silicon, and metal silicides; and
a layer underlying said TEOS layer, selected from the group of metal, silicon, and metal silicides;
said overlying layer contacting said underlying layer through said contact hole.

* * * * *